United States Patent
Berry, III

(10) Patent No.: US 7,888,661 B2
(45) Date of Patent: Feb. 15, 2011

(54) METHODS FOR IN SITU SURFACE TREATMENT IN AN ION IMPLANTATION SYSTEM

(75) Inventor: Ivan L. Berry, III, Amesbury, MA (US)

(73) Assignee: Axcelis Technologies Inc., Beverly, MA (US)

( * ) Notice: Subject to any disclaimer, the term of this patent is extended or adjusted under 35 U.S.C. 154(b) by 289 days.

(21) Appl. No.: 12/030,306

(22) Filed: Feb. 13, 2008

(65) Prior Publication Data

US 2009/0200493 A1  Aug. 13, 2009

(51) Int. Cl.
*H01J 37/317* (2006.01)
*H01L 21/265* (2006.01)

(52) U.S. Cl. .............................. 250/492.21; 250/492.2; 315/111.21; 438/149; 438/513; 438/710; 216/67

(58) Field of Classification Search ............ 250/492.21, 250/492.2; 315/111.21; 438/149, 513, 710; 216/67
See application file for complete search history.

(56) References Cited

U.S. PATENT DOCUMENTS

| 6,905,965 | B2 | 6/2005 | Subrahmanyan et al. |
| 7,053,002 | B2* | 5/2006 | Cohen et al. ................. 438/714 |
| 7,111,629 | B2 | 9/2006 | Kim et al. |
| 2001/0038919 | A1* | 11/2001 | Berry .......................... 428/446 |
| 2007/0228008 | A1* | 10/2007 | Wolfe et al. ................... 216/67 |
| 2007/0246064 | A1 | 10/2007 | Jackson |
| 2008/0160431 | A1* | 7/2008 | Scott et al. ...................... 430/5 |

* cited by examiner

*Primary Examiner*—Nikita Wells
(74) *Attorney, Agent, or Firm*—Eschweiler & Associates, LLC

(57) ABSTRACT

A system and methods are provided for mitigating or removing workpiece surface contaminants or conditions. Methods of the invention provide treatment of the wafer surface to provide a known surface condition. The surface condition can then be maintained during and following implantation of the workpiece surface with a dopant.

14 Claims, 11 Drawing Sheets

METHODS FOR IN SITU SURFACE TREATMENT IN AN ION IMPLANTATION SYSTEM

FIELD OF THE INVENTION

The present invention relates generally to ion implantation systems, and more particularly to a system and method for the in situ surface treatment and passivation of a wafer surface during ion implantation.

BACKGROUND OF THE INVENTION

Ion implantation systems are used to dope semiconductors with impurities in integrated circuit manufacturing. In such systems, an ion source ionizes a desired dopant element, which is extracted from the source in the form of an ion beam of desired energy. The ion beam is then directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for mass resolving the ion beam using magnetic fields, and a target chamber containing the semiconductor wafer or workpiece to be implanted by the ion beam.

In order to achieve a desired implantation for a given application, the dose and energy of the implanted ions may be varied. The ion dose controls the concentration of implanted ions for a given semiconductor material. Typically, high current implanters are used for high dose implants, while medium current implanters are used for lower dose applications. The ion energy is used to control junction depth in semiconductor devices, where the energy levels of the beam ions determine the degree to which ions are implanted or the depth of the implanted ions. The continuing trend toward smaller and smaller semiconductor devices requires a mechanism, which serves to deliver high beam currents at low energies. The high beam current provides the necessary dosage levels, while the low energy permits shallow implants.

The ability to control dopant distribution and junction depth is limited, especially as the doped regions become more shallow.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one embodiment, the invention is directed to a method of treating a workpiece comprising subjecting a workpiece surface to a plasma generated within a plasma chamber operably coupled to a process chamber, wherein the plasma chamber is configured to adjust the workpiece surface to a known surface condition prior to ion implantation of the workpiece in the process chamber.

In another embodiment, the invention is directed to a method of treating a workpiece comprising subjecting a workpiece surface to a plasma generated within a plasma chamber operably coupled to a process chamber, wherein the plasma chamber is configured to adjust the workpiece surface to a known surface condition after the implantation. In another embodiment, the treatment is performed after ion implantation of the workpiece in the ion implantation process chamber.

In a further embodiment, the invention is directed to a method of treating a workpiece comprising subjecting a workpiece surface to a surface deposition of a low molecular weight substance on the wafer either concurrently with an implant or sequentially in a multi-step implant process. The surface deposition operates to reduce ion recoil or backscatter that otherwise operates to limit a total delivery of dopant to the workpiece.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
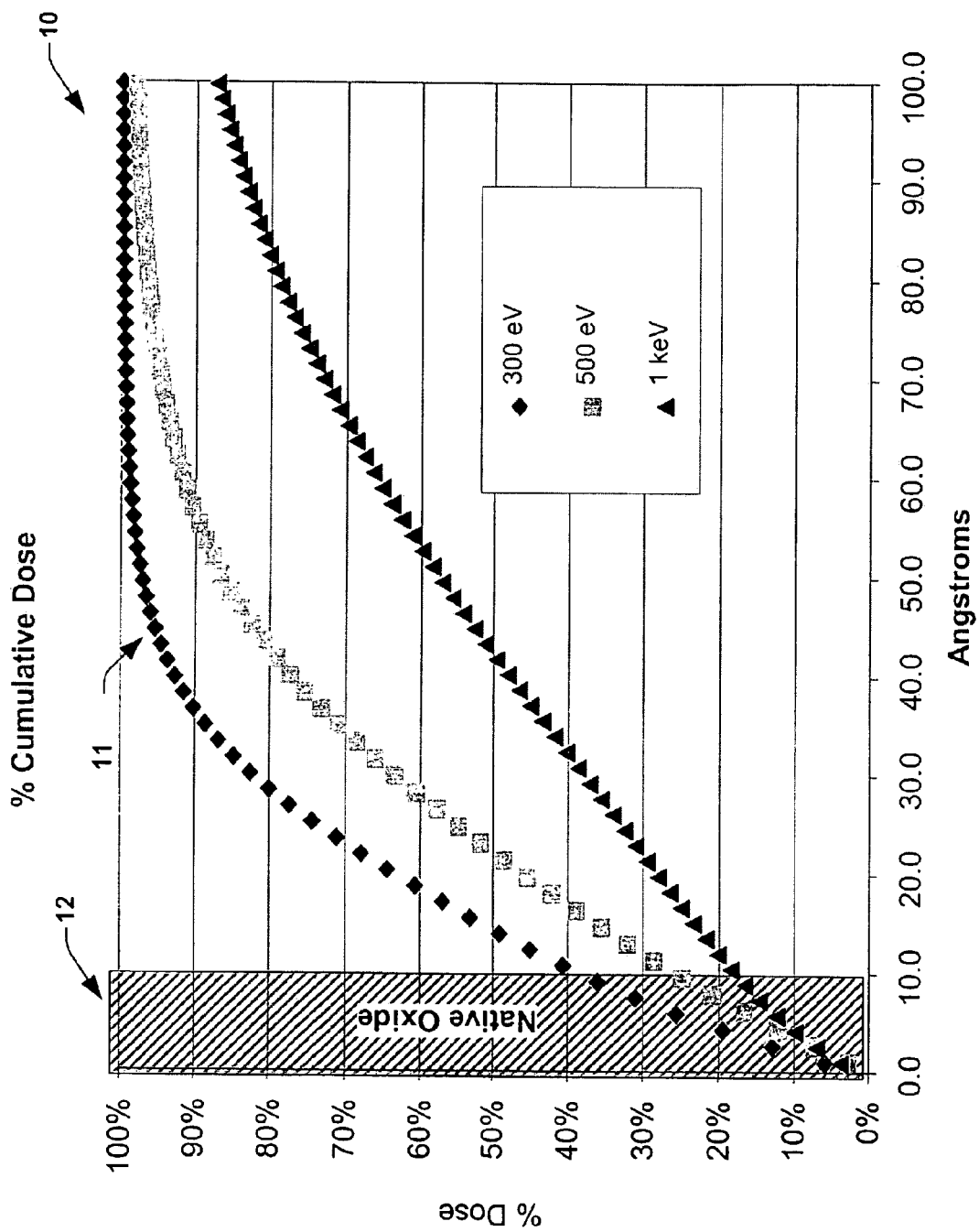
FIG. 1 is a graph illustrating the increasingly larger fraction of implanted dopant that lies within a naturally occurring surface oxide, and showing that variations in the oxide thickness can have increased effects on workpiece as the implant energy is reduced.

The invention will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims.

Many ion implantations performed in current semiconductor fabrication processes are shallow and/or ultra-shallow implants that form shallow and/or ultra-shallow junction depths in formed devices. These shallow and/or ultra-shallow implants typically employ low energies (e.g., less than 1 keV), but require relatively high beam current. Generally, it is appreciated that high current low energy ion beams are obtained by extracting the ion beam from an ion source. Then, the ion beam is mass purified (or analyzed) and transported to a position relatively close to a target wafer or workpiece.

It has been found that the degree of implantation and dopant retention is a function of the condition of the surface of the semiconductor. A surface to be implanted may react with uncontrolled atmospheric conditions, such as temperature, UV exposure, and water vapor, among others, to negatively impact the control of the implantation process. The inventor of the present invention discovered that the wafer surface can include contaminants and/or conditions that can affect the ion distribution within the wafer, and, therefore, the desired dopant profile within the wafer.

Figure 2:
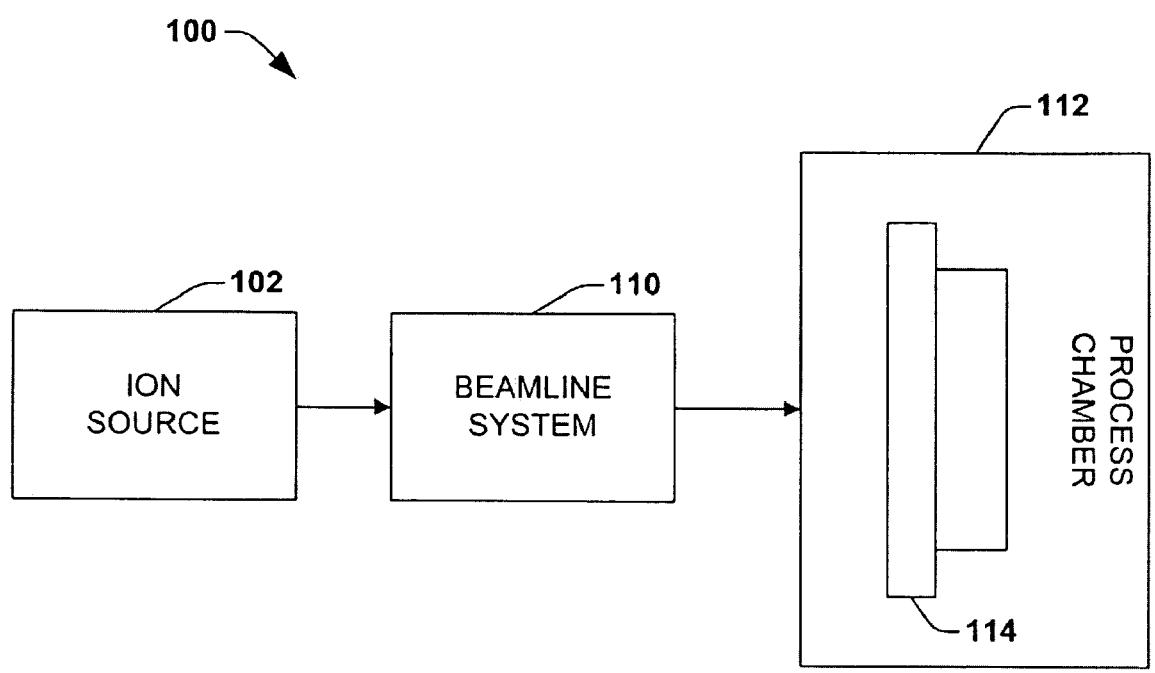
FIG. 2 is a schematic block diagram illustrating components of an ion implantation system.

Referring to FIG. 1, a graph 10 is provided that illustrates the effect of native oxide growth on a workpiece such as a semiconductor wafer. It can be seen at 12 that the native oxide that naturally occurs contains a large fraction of the implanted dopant at low implant energies. At low implant energies as seen in graph 11, about 30% of the dopant is located within this oxide. Slight changes in ths oxide thickness can dramatically affect the dopant within the silicon Referring initially to FIG. 2, a system 100 suitable for implementing ion implantation is depicted in block diagram form. The system 100 is presented for illustrative purposes and it is appreciated that aspects of the invention are not limited to the described ion implantation system and that other suitable ion implantation systems of varied configurations can also be employed. The ion implantation system is generally used to implant ions by colliding an ion beam with a semiconductor workpiece, which is used for integrated circuits and the like.

The system 100 includes an ion source 102 for producing an ion beam along a beam path. A beamline system 110 is provided downstream of the ion source 102 to receive a beam therefrom. The beamline system 110 may include (not shown) a mass analyzer, an acceleration structure, which may include, for example, one or more gaps, and an angular energy filter. The beamline assembly 110 is situated along the path to receive the beam. The mass analyzer includes a field generating component, such as a magnet, and operates to provide a field across the beam path so as to deflect ions from the ion beam at varying trajectories according to mass (e.g., charge to mass ratio). Ions traveling through the magnetic field experience a force which directs individual ions of a desired mass along the beam path and which deflects ions of undesired mass away from the beam path.

A process chamber 112 is provided in the system 100, which receives a mass analyzed ion beam from the beamline system 110 and supports one or more workpieces 114 such as semiconductor wafers along the path for implantation using the final mass analyzed ion beam. The process chamber 112 then receives the ion beam which is directed toward a workpiece 114. It is appreciated that different types of process chambers 112 may be employed in the system 100. For example, a "batch" type process chamber 112 can simultaneously support multiple workpieces 114 on a rotating support structure, wherein the workpieces 114 are rotated through the path of the ion beam until all the workpieces 114 are completely implanted. A "serial" type plasma chamber 114, on the other hand, supports a single workpiece 114 along the beam path for implantation, wherein multiple workpieces 114 are implanted one at a time in serial fashion, with each workpiece 114 being completely implanted before implantation of the next workpiece 114 begins. The process chamber 112 may also include a scanning apparatus for moving the beam with respect to the workpiece, or the workpiece with respect to the beam.

The invention facilitates ion implantation by mitigating or removing workpiece surface contaminants or maintaining well defined surface conditions prior to, during, or following the ion implantation process. Methods of the invention provide treatment of the wafer surface to provide a known surface condition. The surface condition can then be maintained during and following implantation. Providing known surface conditions can include oxidation of a workpiece surface to a known thickness, and adjustment of the surface chemistry, such as, producing or depositing an oxide, nitride, oxy-nitride, hydride, hydroxide, carbide, silicide, hydrocarbon or any other material containing oxygen, nitrogen, hydrogen, carbon, or silicon, to create a surface of a known state.

Figure 3:
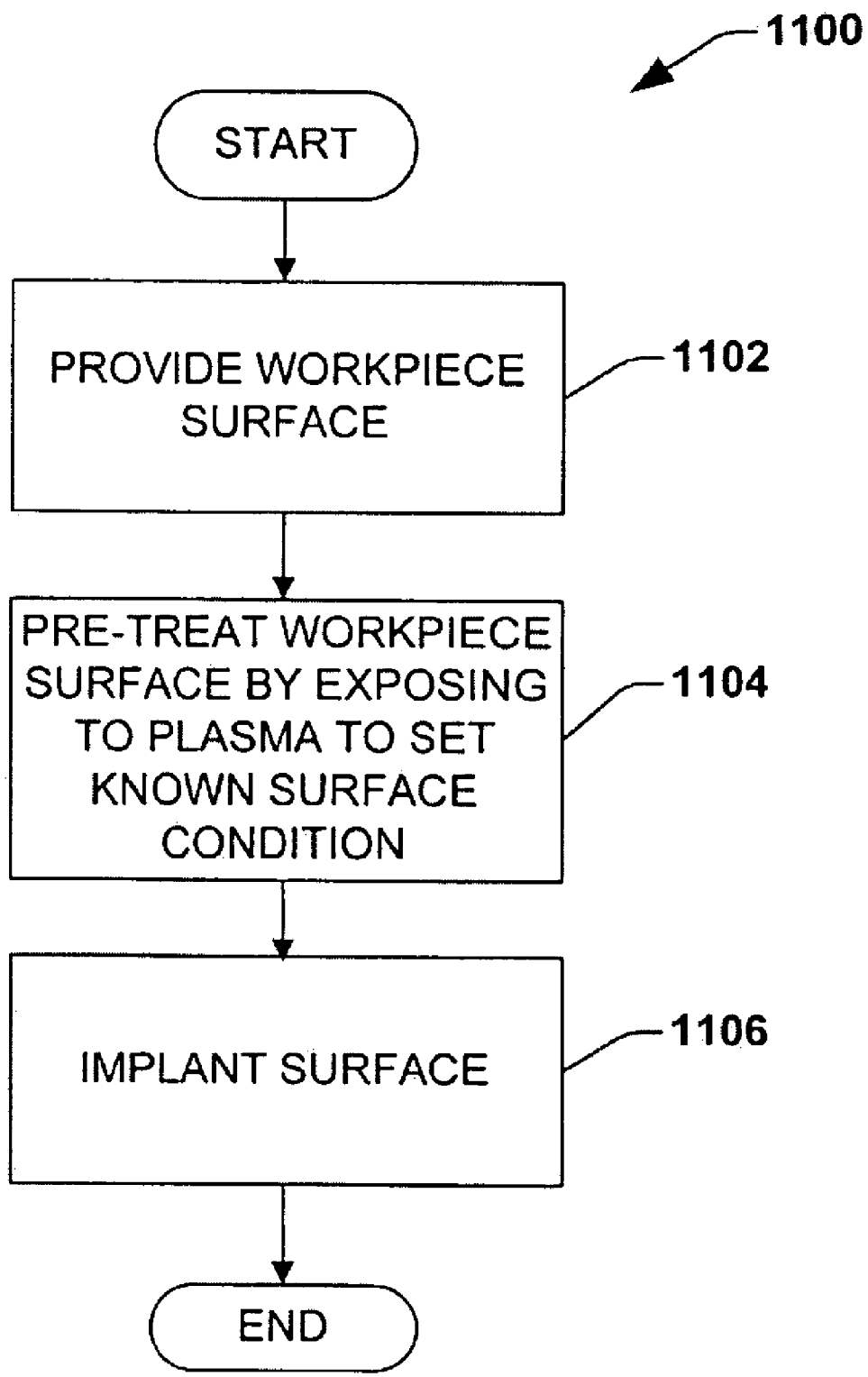
FIG. 3 is a flow diagram illustrating a method for pre-conditioning a wafer prior to ion implantation, to set the surface the condition to a pre-determined, known state according to one embodiment of the invention.

Referring now to FIG. 3 one embodiment of a methodology 1100 of the invention employing is illustrated for treatment of a surface of a workpiece to provide a known surface condition. Although the methodology 1100 is illustrated and described hereinafter as a series of acts or events, it will be appreciated that the invention is not limited by the illustrated ordering of such acts or events. For example, some acts may occur in different orders and/or concurrently with other acts or events apart from those illustrated and/or described herein, in accordance with one or more aspects of the invention. In addition, not all illustrated steps may be required to implement a methodology in accordance with the present invention. Furthermore, the methodologies according to the present invention may be implemented in association with the formation and/or processing of structures illustrated and described herein as well as in association with other structures not illustrated.

The method 1100 begins at 1102, wherein a workpiece surface is provided. The workpiece surface can include any of the common materials used in semiconductor processing, including but not limited to silicon, silicon-germanium, germanium, gallium-arsenide, and indium-phosphide. The workpiece surface is exposed to a plasma pretreatment at 1104 prior to implantation of a dopant in order to adjust the workpiece surface to a known surface condition. The workpiece then proceeds to ion implantation at 1106 after which the method 1100 ends.

In the method 1100, the workpiece surface can be exposed to plasmas produced by exciting a process gas by any number of means such as RF excitation, microwave excitation, dc discharge, electron or ion impact dissociation, wherein the plasma reacts with the surface or deposits a material on the surface in order to set the surface to a known condition. Process gases can include one or more of $O_2$, $O_3$, NO, $NO_2$, $NO_3$, $N_2O$, $NH_3$, $H_2$, $CH_3$, $CF_4$, $C_2F_6$, $CH_3F$, $C_3F_8$, $NF_3$ or an inert gas such as He, Ne, Xe, and Ar. Plasmas can be used in a wide range of temperature and pressure conditions. Normal operating pressures for vacuum plasma pretreatment processes can range from $10^{-6}$ torr up to 100 torr.

Figure 4:
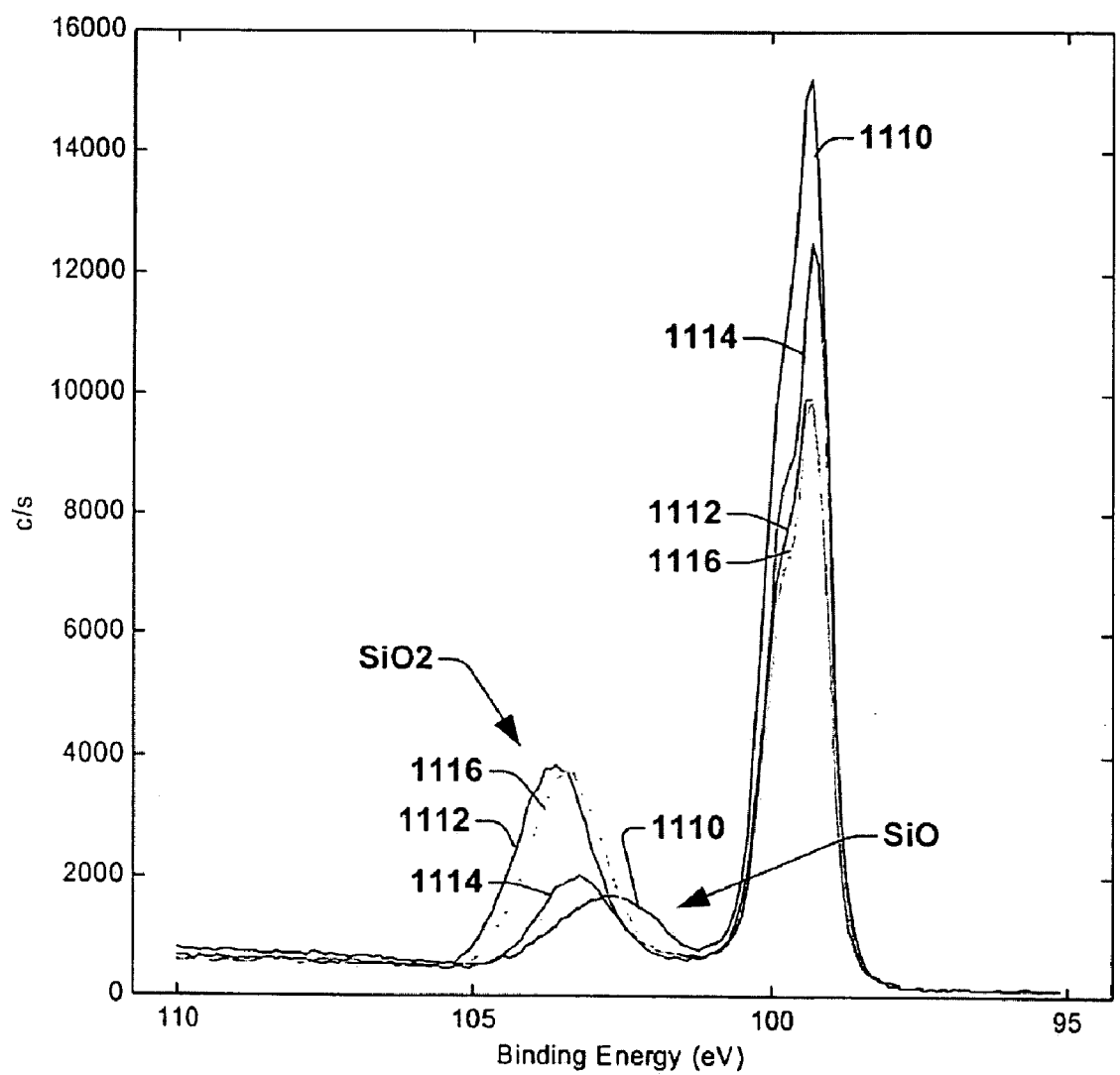
FIG. 4 is a graph illustrating an effect of conditioning a wafer with a plasma after ion implantation according to one embodiment of the invention.

One example of an effect of pre-implant surface treatment can be seen in the graph of FIG. 4. In FIG. 4 a plasma treatment is performed on four different samples, wherein one sample is an HF-vapor cleaned sample approximately 1 day after HF-cleaning (curve 1110), another sample (curve 1114) is approximately 1 month after HF-vapor cleaning, while samples 1112 and 1116 is has been HF-vapor cleaned and exposed to different plasma conditions. More particularly, comparing curves 1110 and 1114, one sees that the native oxide chemical composition changes with time. By adjusting the plasma conditioning processes one obtains curves 1112 and 1116. Evaluation of these samples weeks later has revealed no observable change in the oxide composition or thickness.

By evaluating the binding energies associated with the peaks of the curves, it is readily apparent that the control samples that did not undergo the plasma pre-treatment still have the sub-oxide (SiO), that will continue to oxidize, and thus not be readily controllable. In contrast, the wafers that underwent the plasma pre-treatment have the sub-oxide convert to $SiO_2$ that results in a substantial inhibition of further oxide growth. In the above manner, the plasma pre-implant treatment advantageously facilitates treatment of the wafer surface to a controllable, known surface state.

Figure 5:
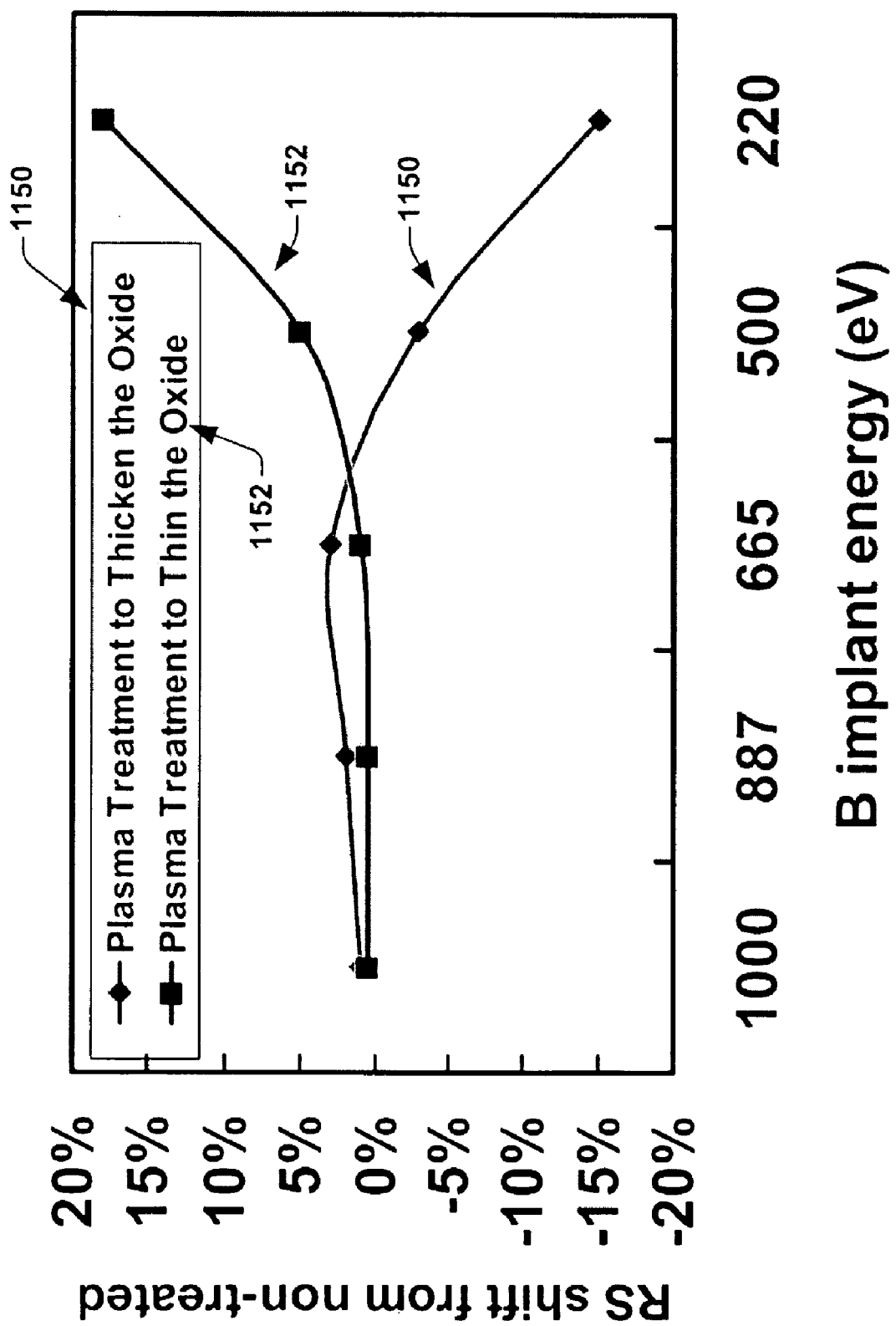
FIG. 5 is a graph illustrating an effect of altering the thickness of the native oxide by different plasma processes according to one embodiment of the invention.

Now referring to FIG. 5, where the Sheet resistance of implanted samples are measured, and realizing that the plasma treatment process can be used to control both the quality and the thickness of the surface oxide, the plasma treatments therefore can affect and control the resultant device performance. For example, by altering this oxide thickness, the sheet resistance of an implanted and annealed sample can be adjusted and controlled. Referring to curve 1150, a relatively thick oxide is grown, thereby retarding dopant outduffision during the implant activation step, which dominates resistivity values at low implant energies, while curve 1152 reduces the native oxide thickness, thereby reducing dopant loss in the oxide, which is a dominate loss mechanism as mid-range implant energies.

Figure 6:
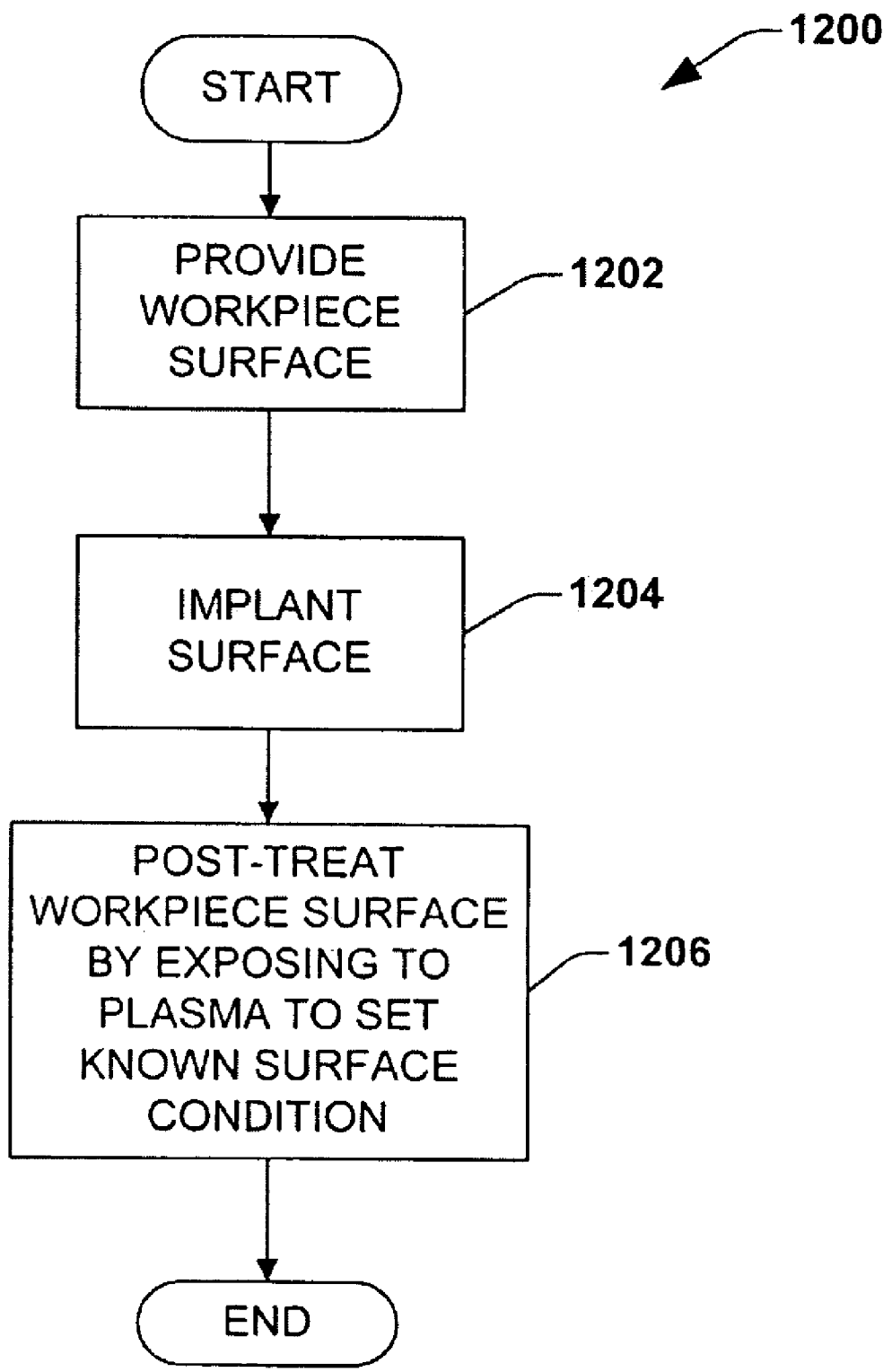
FIG. 6 is a flow diagram illustrating a method for post-implant conditioning a wafer to set the surface the condition to a pre-determined, known state after ion implantation according to another embodiment of the invention.

Referring now to FIG. 6, there is illustrated a further method 1200 in accordance with an embodiment of the invention. The method 1200 begins at 1202, wherein a workpiece surface is provided. The workpiece surface proceeds to ion implantation with a dopant at 1204. Following implantation, the workpiece surface is post-treated 1206 and method 1200 ends.

Post treatment 1206 of the workpiece surface means treatment after the implant, and can include, for example, treatment with a plasma to form a passivation layer, or deposition of a capping layer to prevent dopant out-diffusion. Post treatment 1206 plasmas can include, for example, $O_2$, $H_2$, $CF_4$, $C_2F_6$, $CH_3F$, $C_3F_8$, $NF_3$, $NH_3$, CO, NO, $NO_2$, $NO_3$, $N_2O$, HCN, $O_3$, $CH_4$, or $N_2$. In one embodiment, post treatment 1206 includes deposition of a thin film to provide a protective layer, for example, a $SiO_2$, SiN, or silicon oxynitride layer. Such layers can be formed in accordance with one embodiment of the invention with a thickness of from about one mono-layer to about 50 monolayers.

In one embodiment of the method 1200, post treatment 1206 can further include removal of a photo resist previously applied to the workpiece surface.

Figure 7:
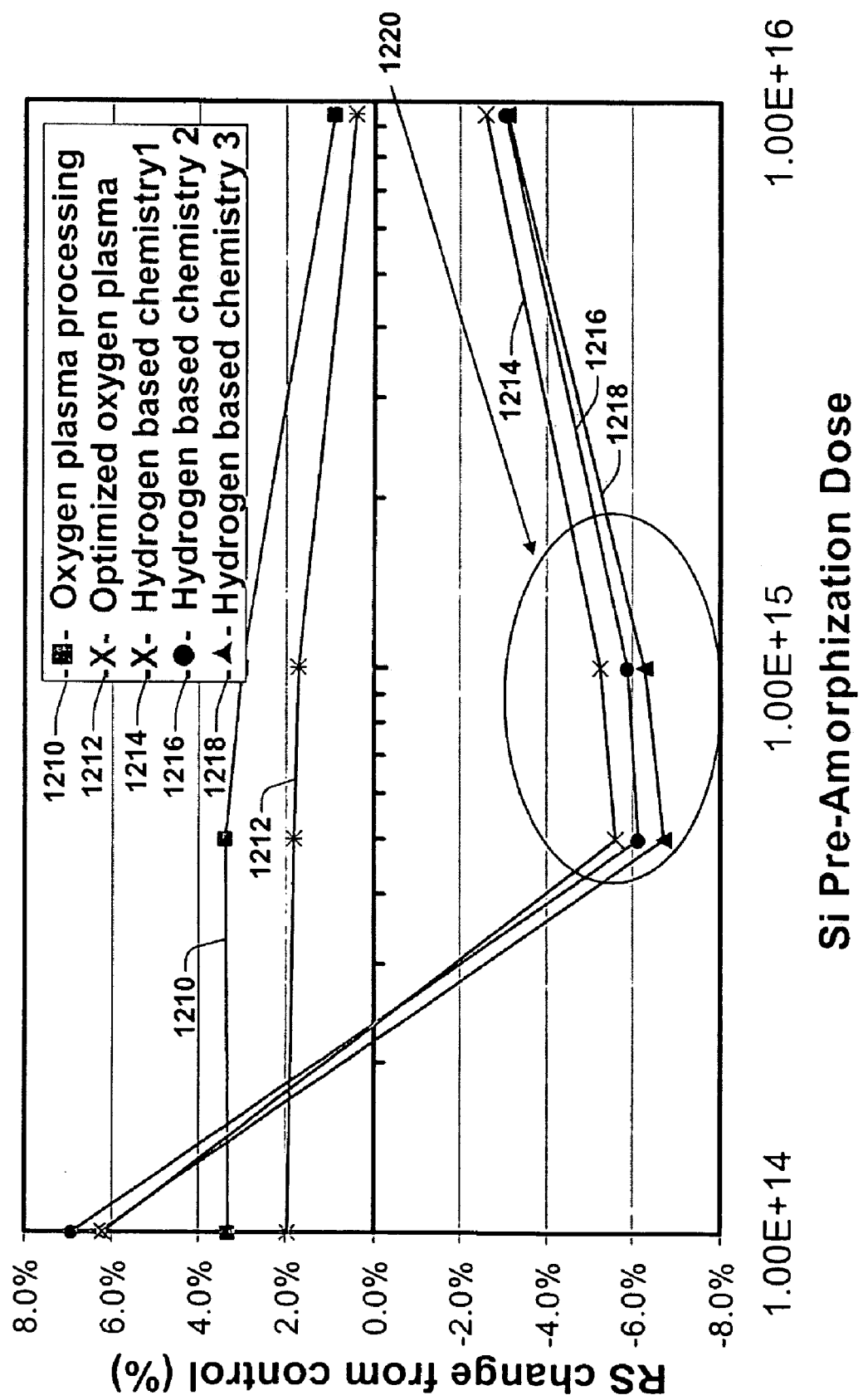
FIG. 7 is a graph illustrating an effect of post-implant conditioning on dopant activation according to one embodiment of the invention.
Figure 8:
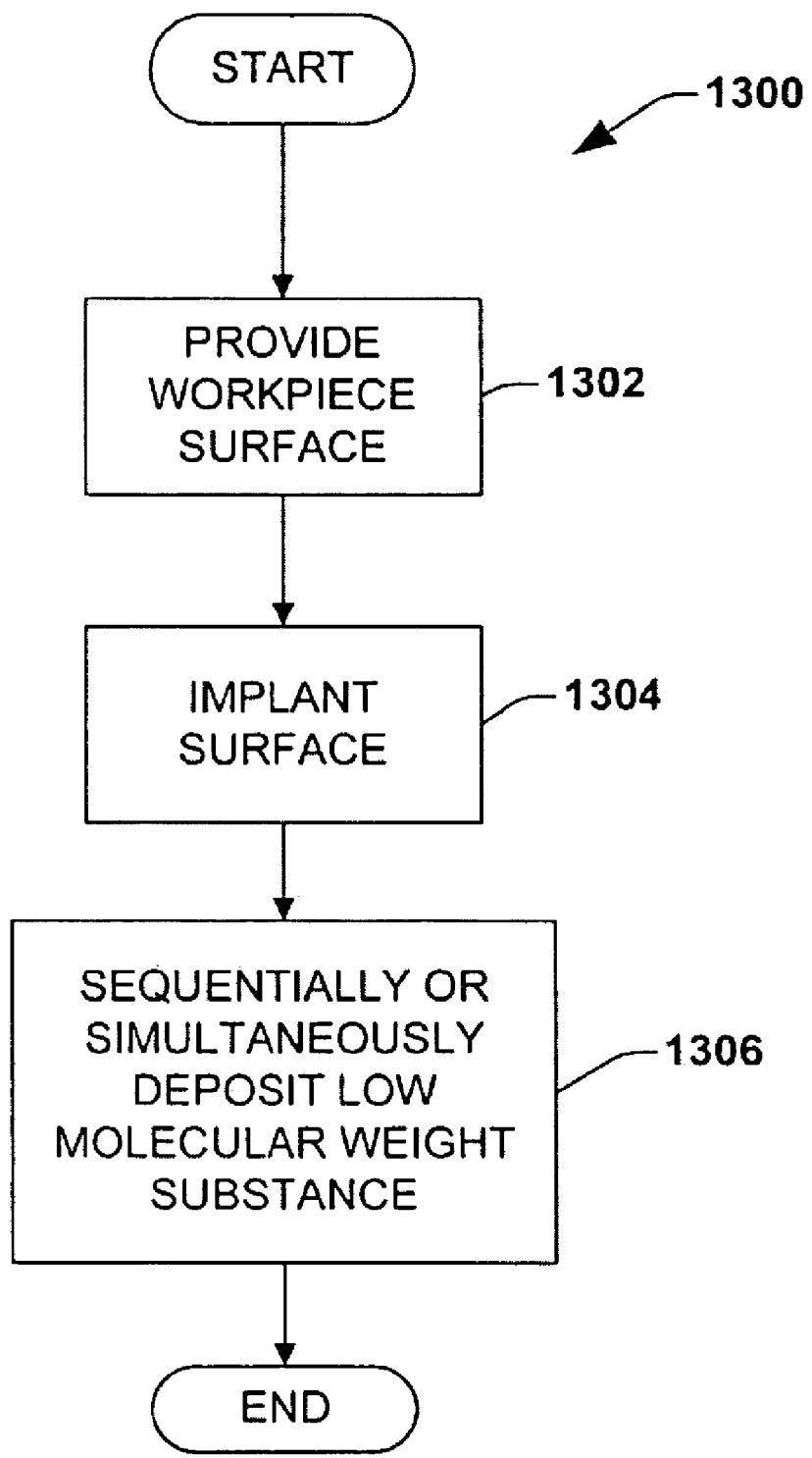
FIG. 8 is a flow diagram illustrating a method for depositing a material or modifying the surface concurrent with the ion implantation to maintain a surface condition during the ion implantation.

One effect of such post-implant treatment can be seen in FIG. 7. FIG. 7 is a graph that illustrates a percentage change in sheet resistance (RS) from a control sample over a range of implant doses caused by various post-implant treatments. Curve 1210 illustrates an effect of an oxygen plasma process, while curve 1212 illustrates the results for an optimized oxygen plasma process where the thickness of the oxide was controlled to minimize dopant incorporation. Curves 1214, 1216, and 1218 are curves that illustrate results for three different hydrogen based plasma chemistries. As can be seen in FIG. 7, the substantial reduction in sheet resistance at 1220 illustrates what is believed to be an increased dopant activation caused by the post-implant treatments. This increase in dopant activation is only seen when the implant is pre-amorphized or the implant is self-amorphizing (with for example Silicon as seen in the figure), as the amorphization allows the hydrogen from the plasma to substantially penetrate into the workpiece, According to another embodiment of a method of the invention, ion recoil backscatter which limits the total delivered ion dose, is reduced by a controlled surface deposition of a low molecular weight substance on a surface of the workpiece. Referring to FIG. 8, in the method 1300, a workpiece surface is established 1302. A low molecular weight substance, for example, carbon or a hydrocarbon, is deposited on the wafer surface 1306. In one embodiment, the low molecular weight substance is deposited 1306 while implanting the dopant 1304. In another embodiment, deposition of the substance occurs sequentially, 1306, multiple deposition ion implantation cycles during the implantation of the dopant 1304. For purposes of illustration, deposition 1306 is shown as following ion implantation 1304 in FIG. 8, however, this is not required. The substance will be deposited, according to one embodiment, on the surface at a thickness ranging from about 1 to about 50 monolayers. Systems suitable for implementing embodiments illustrated in methods 1100 and 1200 of the invention are provided.

Figure 9A:
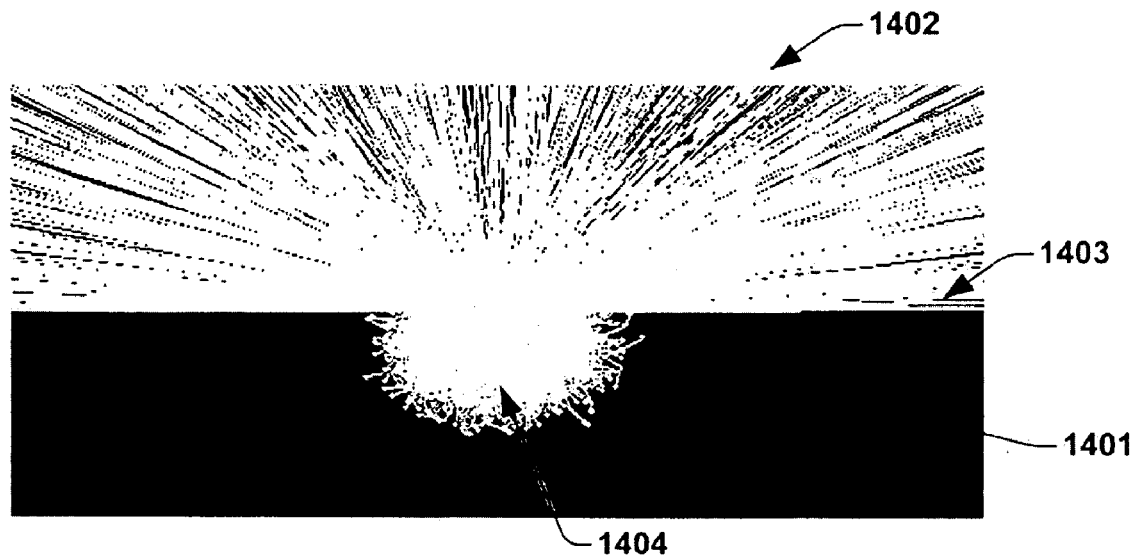
FIGS. 9A and 9B are diagrams illustrating an effect of depositing a 3 monolayer thick carbon film during the ion implantation process to reduce the effect of ion backscattering according to one embodiment on the invention.
Figure 9B:
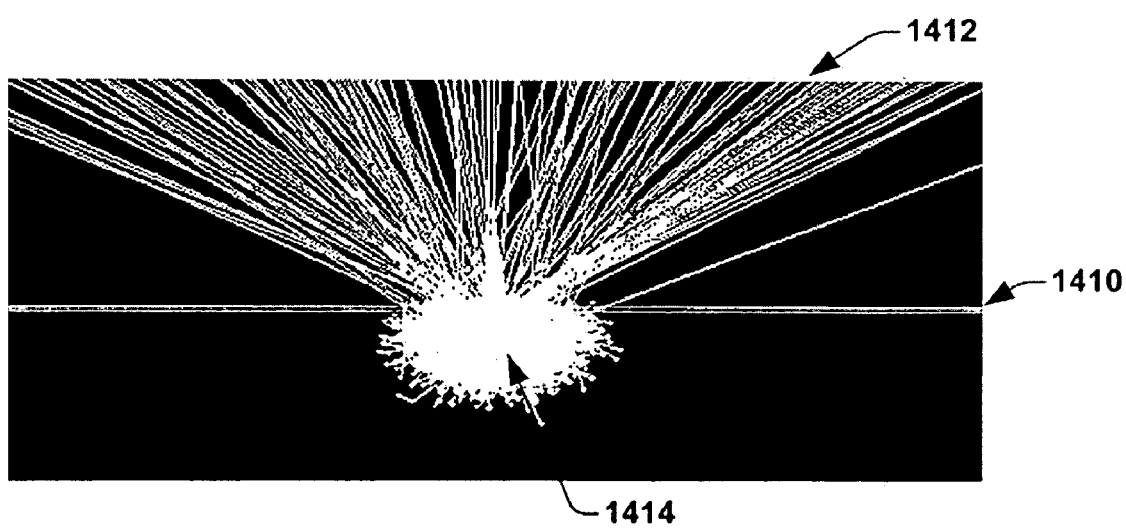

FIGS. 9A and 9B represent a computer simulation of implantation of a low energy boron at 300 eV into a workpiece sample. Referring to FIG. 9A, the sample, 1401, is single crystal Silicon, where one finds a substantial fraction of the implanted ions are back-scattered, 1402, from the surface, 1403, resulting in a substantial fraction of the ions not being implanted, 1404, into the sample, Whereas in FIG. 9B, the sample workpiece is coated with a 3 monolayer thick amorphous carbon surface layer 1410 during the implantation process. As is readily observable, a substantially less fraction of the ions are recoiled or back-scattered, 1412, from the surface, resulting in a substantially larger fraction of the ions 1414 being implanted into the sample.

Figure 10:
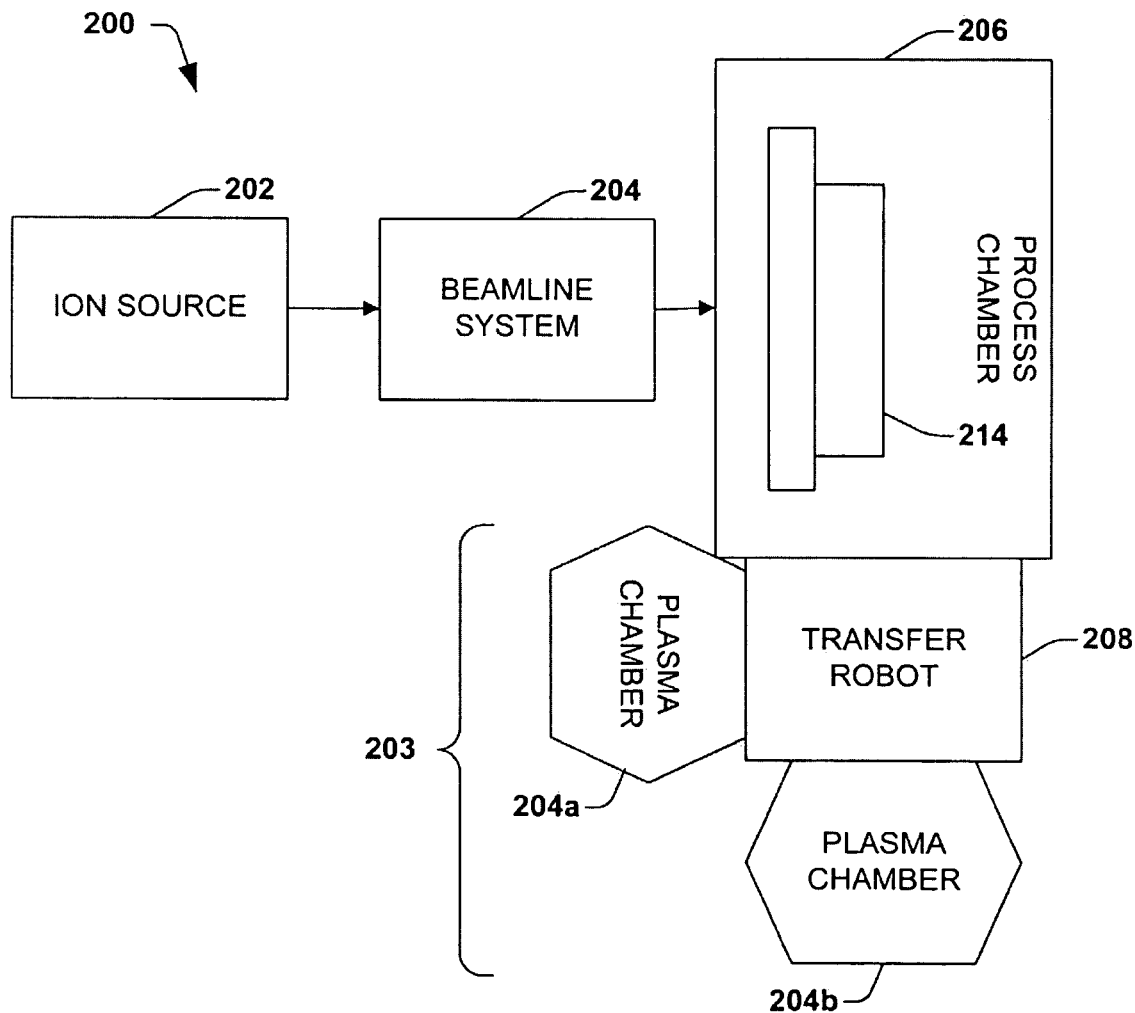
FIG. 10 is a schematic block diagram of an ion implantation system in accordance with an embodiment of the invention including one or more plasma chambers externally coupled to a process chamber.

In one embodiment of the system 100 of the invention, as illustrated in FIG. 10, an ion implantation system 200 includes an ion source 202 for producing an ion beam. A beamline system 204 is situated along the path to receive the beam. Ion implantation system 200 further includes a plasma surface treatment tool 203. The plasma surface treatment tool 203 comprises one or more plasma chambers 204a, 204b externally coupled to a process chamber 206. Plasma chambers 204a, 204b and process chamber 206 are located within a common vacuum system so that the workpiece 214 is not exposed to atmospheric conditions when transferred therebetween. Movement of the workpiece 214 from plasma chamber 204a, 204b to process chamber 206 can occur by a suitable handler, for example, a transfer robot 208, as illustrated. However, the mechanism by which workpieces 214 are introduced into the chamber 206 is not critical to the system and methods of the invention.

Figure 11:
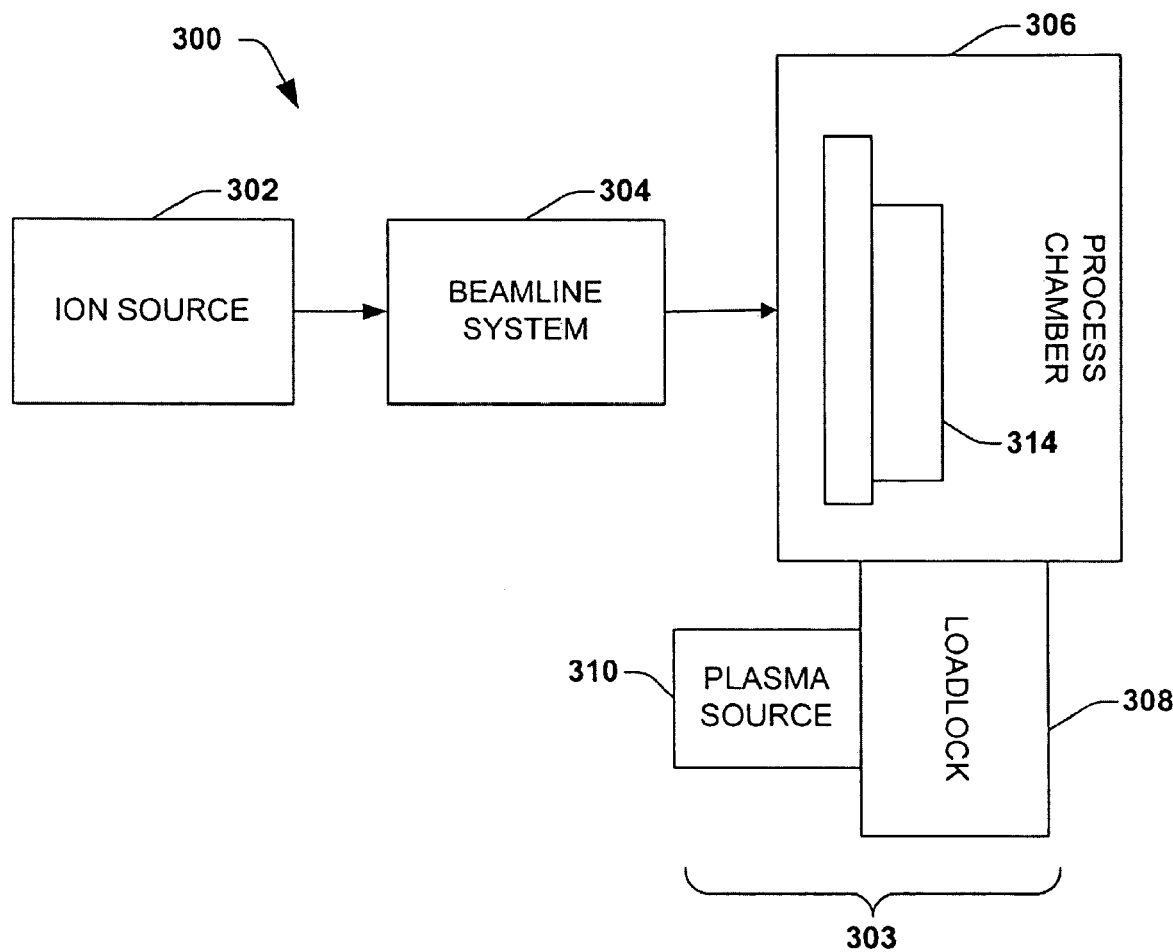
FIG. 11 is a schematic block diagram of an ion implantation system in accordance with an embodiment of the invention including a plasma source and loadlock chamber.

In FIG. 11 there is illustrated another embodiment in accordance with the invention. Implantation system 300 includes ion source 302, beam line system 304 and process chamber 306. A plasma surface treatment tool 303 comprising a loadlock chamber 308 is operably coupled to plasma source 310. Workpiece 314 is situated in loadlock chamber 308 and pumped to vacuum. Workpiece 314 is then exposed to plasma from plasma source 310 while in loadlock chamber 308. Workpiece 314 proceeds to process chamber 306 for ion implantation.

In view of the foregoing structural and functional features described supra, methodologies in accordance with various aspects of the invention will be better appreciated with reference to the above figures and descriptions. While, for purposes of simplicity of explanation, the methodologies described below are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention may include a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. A method of treating a workpiece comprising:
   establishing a workpiece within an ion implantation system, the ion implantation system comprising a loadlock chamber operably coupled to a plasma source or;
   exposing a surface of the workpiece to a plasma generated by the plasma source within the ion implantation system to adjust and maintain the workpiece surface to a known surface condition.

2. The method of claim 1, the workpiece surface comprising silicon, silicon-germanium, germanium, gallium-arsenide, gallium-aluminum-arsenide, or indium-phosphide.

3. The method of claim 1, the exposing occurring following implantation of the workpiece surface to form a passivation layer.

4. The method of claim 3, further comprising depositing a thin film protective coating comprising silicon dioxide, silicon nitride, or silicon oxynitride on the workpiece surface.

5. The method of claim 1, the known surface condition comprising one or more of oxidation of the workpiece surface to a known thickness or adjustment of the surface chemistry to a known value.

6. The method of claim 5, the surface chemistry adjustment comprising adjustment of the oxygen, nitrogen, hydrogen and/or carbon content to a known value.

7. The method of claim 1, further comprising ion implanting the workpiece surface with a dopant while the workpiece surface is maintained at the known surface condition.

8. The method of claim 1, where the surface of the workpiece comprises an oxide, and wherein exposing the surface of the workpiece to the plasma to adjust and maintain the workpiece surface to the known surface condition comprises adjusting and maintaining a thickness of the oxide to a known thickness.

9. The method of claim 8, further comprising:
   implanting dopant ions into the workpiece surface while the thickness of the oxide is maintained at the known thickness.

10. The method of claim 1:
    wherein the workpiece surface comprises at least one of: an oxygen content, a nitrogen content, a hydrogen content, or a carbon content, and
    wherein exposing the workpiece surface to the plasma to adjust and maintain the workpiece surface to the known surface condition comprises adjusting and maintaining at least one of: the oxygen content, the nitrogen content, the hydrogen content, or the carbon content.

11. The method of claim 10, further comprising implanting dopant ions into the workpiece surface while at least one of: the oxygen content, the nitrogen content, the hydrogen content, or the carbon content is maintained.

12. An ion implantation system for treating a workpiece comprising:
    an ion source operable to produce an ion beam;
    a plasma surface treatment tool configured to adjust and maintain a workpiece surface to a known surface condition, the plasma surface treatment tool comprising a loadlock chamber operably coupled to a plasma source or; and
    a process chamber configured to house the workpiece while the surface treatment tool adjusts and maintains the workpiece surface to the known condition.

13. The system of claim 12, the plasma chambers and process chamber located within a common vacuum system.

14. The system of claim 12, the known surface condition comprising one or more of oxidation of the workpiece surface to a known thickness or adjustment of the surface chemistry to a known value or the deposition of a thin low molecular weight substance.

* * * * *